(12) United States Patent
Ly-Gagnon

(10) Patent No.: US 8,489,045 B2
(45) Date of Patent: Jul. 16, 2013

(54) METHOD AND SYSTEM FOR ADJUSTING TRANSMISSION POWER

(75) Inventor: Yann Ly-Gagnon, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 192 days.

(21) Appl. No.: 13/019,821

(22) Filed: Feb. 2, 2011

(65) Prior Publication Data

US 2012/0196546 A1    Aug. 2, 2012

(51) Int. Cl.
*H03C 1/62* (2006.01)
(52) U.S. Cl.
USPC ............... 455/115.1; 455/522; 455/115.2; 455/115.3; 455/114.3
(58) Field of Classification Search
USPC ............ 455/13.4, 522, 67.11, 67.14, 67.7, 455/68, 115.1, 115.2, 127.2, 136, 226.1, 455/226.4, 232.1, 234.1, 115.3, 114.3, 91
See application file for complete search history.

(56) References Cited

U.S. PATENT DOCUMENTS

| | | | |
|---|---|---|---|
| 5,712,593 A | 1/1998 | Buer et al. | |
| 2004/0180686 A1 | 9/2004 | Nakayama | |
| 2005/0095993 A1 | 5/2005 | Kim et al. | |
| 2006/0105769 A1* | 5/2006 | Flondro et al. | 455/437 |
| 2008/0309405 A1* | 12/2008 | Young et al. | 330/149 |
| 2009/0247095 A1 | 10/2009 | Pan | |
| 2010/0022194 A1* | 1/2010 | Rofougaran | 455/73 |
| 2010/0022208 A1* | 1/2010 | Cole et al. | 455/114.3 |
| 2010/0317295 A1 | 12/2010 | Borsella et al. | |

FOREIGN PATENT DOCUMENTS

| | | |
|---|---|---|
| WO | WO 00/25445 A1 | 5/2000 |
| WO | WO 2004/004176 A1 | 1/2004 |

OTHER PUBLICATIONS

International Search Report and Written Opinion—PCT/US2012/022324—ISAEPO—Apr. 13, 2012.

* cited by examiner

*Primary Examiner* — Tuan Pham
(74) *Attorney, Agent, or Firm* — Mahamedi Paradice Kreisman LLP

(57) ABSTRACT

A system and method for measuring transmission power distortion in a wireless communication device are disclosed. In one embodiment, the method comprises reading an operating temperature of the wireless communication device and enabling a loopback path between a transmission circuit and a receiver circuit of the wireless communication device. Using the loopback path, the wireless communication device can calibrate the transmission power output by storing data for compensating the distortion of the transmission power. The data can be stored in a calibration look up table for use by the wireless communication device.

10 Claims, 8 Drawing Sheets

METHOD AND SYSTEM FOR ADJUSTING TRANSMISSION POWER

TECHNICAL FIELD

The disclosed embodiments relate generally to the use of radio communication devices, and in particular, to correct transmission power distortion in a radio communication device.

BACKGROUND OF THE INVENTION

Modern electronic devices typically include a plurality of integrated circuit (IC) or semiconductor chips that communicate with each other. Wireless communication devices, such as Wi-Fi and Bluetooth enabled devices, include transmitter and receiver circuits that exchange data between each other using radio frequency (RF) signals. Typically, the power level of RF signals output by the transmitter circuits are specified to meet various standards (e.g., set forth by the FCC, the IEEE, and others) and/or to meet customer specifications. As known in the art, transistor operating characteristics vary with temperature, and thus the power level of signals output by the transmitter circuits also varies with temperature. Indeed, changes in the operating temperature of such wireless communication devices may result in output power levels that do not meet the specified power levels, and may also result in data distortion and/or data loss.

To compensate for changes in operating temperature, a look-up table provided within each of a plurality of similar wireless communication devices can be used to maintain the power of the device's output signal at a constant level in response to temperature changes. More specifically, the look-up table provided within each wireless communication device stores a plurality of predetermined power correction values for a corresponding plurality of temperatures, and if the temperature changes during normal operation of the device, the look-up table provides a corresponding power correction value to the device's transmitter circuit, which in response thereto adjusts the power level of the output signal to compensate for the temperature change.

The predetermined power correction values are typically generated by selecting one of a plurality of the devices for testing prior to delivery to customers, measuring the output power level of the selected test device for a variety of different temperatures, and then determining a desired power setting level and an associated correction value for each of the different temperatures. Then, the same set of correction values is programmed into the look-up table within each of the devices prior to their delivery to customers. In this manner, all like devices (e.g., all devices belonging to a particular product family) have identical power correction values programmed therein, and thus should all behave identically over various operating temperature ranges.

However, because of process variations inherent in the fabrication of semiconductor devices, devices of the same design (e.g., having identical transistor layouts) typically have varying operating characteristics. For example, although transistor size may be precisely controlled, imperfections in available doping technologies typically result in transistors of the same design behaving differently, and therefore devices fabricated from different wafers (or even from different portions of the same wafer) usually have different operating characteristics. Thus, although a plurality of IC devices can be designed and fabricated to have the same specified operating characteristics, these devices inevitably operate differently from one another, especially during variations in operating temperatures. Accordingly, the predetermined power correction values derived from the selected test device and then stored in each device's look-up table provides only an approximation of how the output power of each device will change in response to temperature fluctuations, and therefore do not ensure that every device will meet its specified operating characteristics in response to temperature variations.

One solution is to individually test each device to calculate power correction values specific to that device before the device is delivered to customers. Unfortunately, measuring the output signal power for each and every device for a variety of different temperatures would be time-consuming, labor-intensive, and expensive, and is therefore not practical for large-scale production of a semiconductor product. Thus, what is needed is an improved method for maintaining the output power of wireless communication devices at a constant level despite variations in operating temperatures.

BRIEF DESCRIPTION OF THE DRAWINGS

The disclosure herein is illustrated by way of example, and not by way of limitation, in the figures of the accompanying drawings and in which like reference numerals refer to similar elements, and in which.

DETAILED DESCRIPTION

Figure 1:
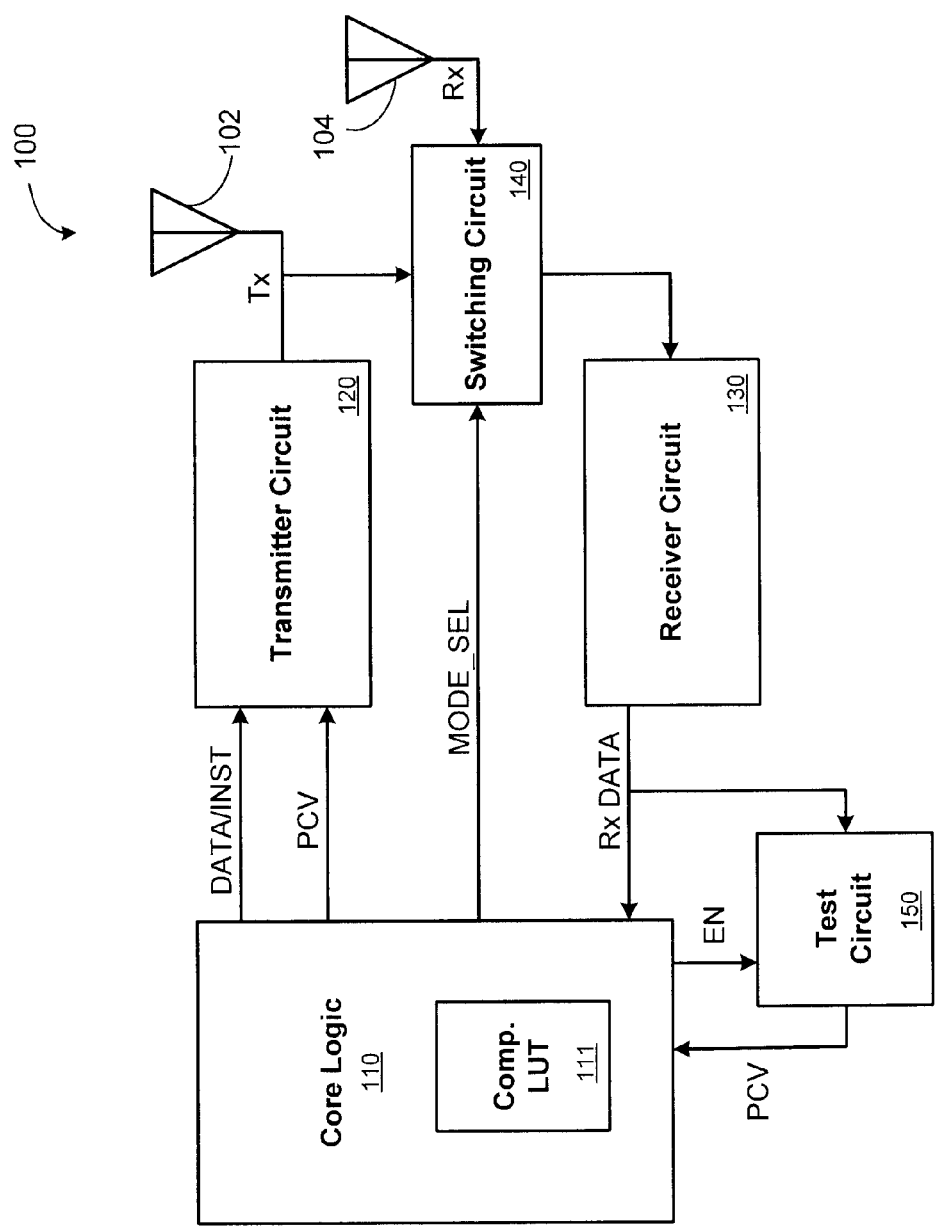
FIG. 1 is a block diagram of a wireless communication device according to some embodiments.

A method and apparatus are disclosed for dynamically calibrating a wireless communication device to maintain a constant level of output signal power over temperature fluctuations. For simplicity, the present embodiments are discussed below in the context of an exemplary wireless communication device. However, it is to be understood that the present embodiments may be implemented in various other devices to dynamically measure and compensate for power and/or signal distortion caused by temperature and/or process variations. Accordingly, the present embodiments are not to be construed as limited to specific examples described herein, but rather includes within its scope all embodiments defined by the claims.

In the following description, numerous specific details are set forth such as examples of specific components, circuits, software and processes to provide a thorough understanding of the present disclosure. Also, in the following description and for purposes of explanation, specific nomenclature is set forth to provide a thorough understanding of the present embodiments. However, it will be apparent to one skilled in the art that these specific details may not be required to practice the present embodiments. In other instances, well-known circuits and devices are shown in block diagram form to avoid obscuring the present disclosure. The term "coupled" as used herein means connected directly to or connected through one or more intervening components or circuits. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of myriad physical or logical mechanisms for communication between components.

An exemplary wireless communication device is disclosed that includes a core logic, a transmitter circuit, a receiver circuit, a test circuit, and a switching circuit. The core logic is coupled to the transmitter circuit, the receiver circuit, the test circuit, and the switching circuit. When an idle transmission period is detected, the wireless device enters a test or calibration mode during which the switching circuit connects the transmitter circuit and the receiver circuit together to form a loop path, and the core logic generates a test signal for output by the transmitter circuit. The test signal is received by the receiver circuit, and the test circuit compares the power and/or distortion levels of the received test signal with the expected power levels for the current operating temperature. A dynamic power correction value for the current operating temperature is derived from the comparison, and then stored in a compensation look-up table. Thereafter, the wireless device returns to its normal operational mode during which the switching circuit disconnects the transmitter circuit and the receiver circuit from each other, thereby allowing both the transmitter circuit and the receiver circuit to operate in a normal manner.

Subsequently, when a change in operating temperature is detected during the normal operational mode, the dynamic power correction value stored in the compensation look-up table for the corresponding temperature can be used to adjust operation of one or more components (e.g., such as a power amplifier) within the transmitter circuit so that the transmission power is maintained at a constant level (e.g., at the specified power level) and distortion is minimized. In this manner, the power correction values for various operating temperatures are dynamically determined by the device after deployment in the field, and therefore reflect semiconductor fabrication process variations specific to the device. Accordingly, the power correction values dynamically determined by the device are more accurate in maintaining constant output signal power levels than the predetermined power correction values previously derived from the selected test device, which as mentioned above is typically a different device that was tested in the laboratory. In addition, the ability for each device to dynamically update its power correction values can also be used to compensate for device operating characteristics that may change over time (e.g., as the device ages).

For some embodiments, the compensation look-up table is initially programmed with a plurality of predetermined power correction values that were derived from the selected test device. For such embodiments, once a dynamic power correction value has been dynamically calculated for a particular operating temperature by the device (i.e., during the calibration mode while the device is deployed in the field), the corresponding predetermined power correction value in the compensation look-up table is replaced by the new dynamic power correction value.

FIG. 1 is a block diagram illustrating a wireless communication device 100 in accordance with some embodiments. The wireless communication device 100 is configured to transmit and receive wireless communication signals, such as cellular communication signals, wireless LAN signals governed by the IEEE 802.11 standards, Bluetooth signals, and other radio frequency (RF) signals. For the exemplary embodiment of FIG. 1, the wireless communication device 100 is shown to include core logic 110, a transmitter circuit 120, a receiver circuit 130, a switching circuit 140, and a test circuit 150, as well as a transmission antenna 102 and a reception antenna 104. Other well-known elements of the wireless communication device 100 (e.g., clock and control signals, power supplies, and so on) are not shown for simplicity.

The core logic 110 controls various operations of the components of the wireless communication device 100. More specifically, core logic 110 includes one or more processors (not shown for simplicity) that generate data signals for transmission to one or more other wireless communication devices (not shown for simplicity) via transmitter circuit 120 and its associated transmission antenna 102, and that process data signals received from one or more other wireless communication devices via the receiver circuit 130 and its associated reception antenna 104. For example, the wireless communication device 100 can transmit a wireless data signal via transmission antenna 102 using the Bluetooth protocol to another wireless device capable of receiving the data signal. Similarly, the wireless communication device 100 can receive a wireless data signal from another wireless device via reception antenna 104 using the Bluetooth protocol.

For some embodiments, the transmitter circuit 120 is configured to output signals having a specific amount of power through its transmission antenna 102. The specified amount of output power is typically measured in dBm (a power ratio in decibels referenced to one milliwatt), and can be stored in a suitable memory location within the transmitter circuit 120. For some embodiments, the power levels settings are stored in a transmission power control (TPC) table provided within or associated with the transmitter circuit 120. For example, some wireless transmission protocols specify an output signal power level of 12 dBm. Of course, for other embodiments, other output signal power levels may be specified. More specifically, for some embodiments, the TPC table (not shown in FIG. 1 for simplicity) stores a plurality of gain values for various power level settings having 4 dBm increments (e.g., gain values for a power level setting of 16 dBm, gain values for a power level setting of 12 dBm, gain values for a power level setting of 8 dBm, gain values for a power level setting of 4 dBm, and so on). Then, during normal operation of the wireless device 100, a gain value is selected for the transmitter circuit 120, for example, depending upon the transmission protocol used (e.g., Bluetooth or Wi-Fi), handshake mechanisms, and/or other factors.

The core logic 110 also includes a compensation look-up table (LUT) 111 that, for some embodiments, is initially programmed (e.g., prior to customer delivery) with a plurality of predetermined power correction values (PCV), each derived for a corresponding operating temperature during testing of a selected device of the same design. During normal operation, the core logic 110 can use the current operating temperature as an input (e.g., a look-up value) to compensation look-up table 111 to retrieve a corresponding power correction value for use by the transmitter circuit 120 to select an output power level setting and/or selectively apply an additional gain value or an attenuation value of the output signal to maintain the output signal power at a constant level.

For example, the retrieved power correction value may indicate that a power amplifier within the transmitter circuit 120 configured to transmit output signals at 12 dBm actually transmits output signals at only 10.5 dBm when the operating temperature is 50° C. Thus, to achieve the desired output power level of 12 dBm, the power setting of the power amplifier may be adjusted to the next highest available level (e.g., 16 dBm), and then an appropriate attenuation value may be applied to reduce the actual power level to the desired level of 12 dBm. Thus, in accordance with present embodiments, each power correction value may include a power level setting level and an attenuation/gain value for the corresponding operating temperature. These power correction values stored in the LUT 111 can be used to supplement (e.g., dynamically adjust) the gain values and power level settings stored in the TPC table of the transmitter circuit 120 to maintain a constant output signal power during temperature variations.

The core logic 110 is also coupled to switching circuit 140 and to test circuit 150. The switching circuit 140 includes a first data input coupled to the output of the transmitter circuit 120, a second data input coupled to the reception antenna 104, a data output coupled to the receiver circuit 130, and a control input to receive a mode select signal (MODE_SEL) from the core logic 110. In response to the MODE_SEL signal, the switching circuit 140 selectively connects either the output of the transmitter circuit 120 or the reception antenna 104 to the input of the receiver circuit 130. For example, when MODE_SEL is de-asserted to indicate a normal operational mode, the switching circuit 140 connects the reception antenna 104 to the receiver circuit 130 and does not receive signals from the transmitter circuit 120, thereby allowing the wireless communication device 100 to operate in a normal manner. When MODE_SEL is asserted to indicate the calibration mode, the switching circuit 140 connects the output of the transmitter circuit 120 to the input of the receiver circuit 130 and does not receive signals from the reception antenna 104, thereby forming a loop path through the transmitter circuit 120 and the receiver circuit 130 that allows the device 100 to dynamically update its power correction values for a current operating temperature, as described in more detail below. For some embodiments, the switching circuit 140 can be a multiplexer having a control input to receive the MODE_SEL signal.

In accordance with the present embodiments, the device 100 can be configured to automatically enter the calibration mode when there is transmission downtime during normal operation of the device 100. For some embodiments, the core logic 110 determines when there is a transmission downtime, which may be defined herein as a period of time or a predetermined transmission slot (e.g., a few milliseconds) during which the transmitter circuit 120 is not transmitting output signals to the transmission antenna 102. For other embodiments, the transmitter circuit 120 can determine when there is transmission downtime and alert the core logic 110 accordingly. When transmission downtime is detected, the core logic 110 asserts the MODE_SEL signal, which in turn causes the switching circuit 140 to connect the output of the transmitter circuit 120 to the input of the receiver circuit 130 to facilitate calibration operations. In addition, core logic 110 asserts an enable signal EN to enable the test circuit 150 to calculate the updated power correction values. For some embodiments, the signals MODE_SEL and EN can be the same signal.

Figure 2:
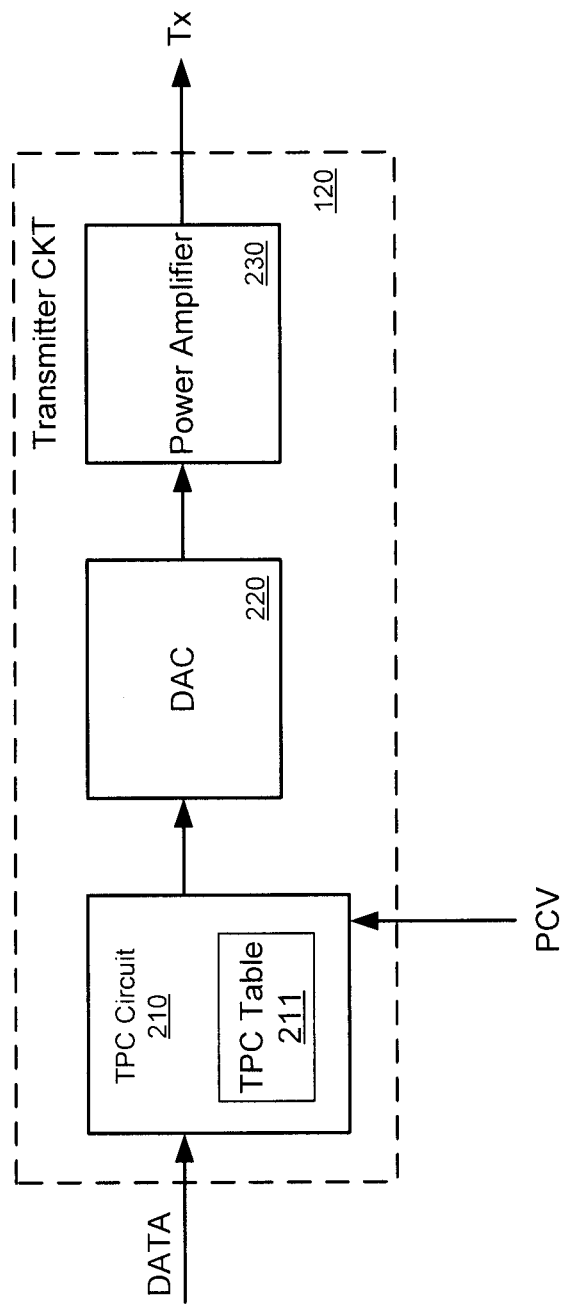
FIG. 2 is a block diagram of one embodiment of the transmitter circuit of FIG. 1.

FIG. 2 shows one embodiment of the transmitter circuit 120 as including a transmission power control (TPC) circuit 210, a digital-to-analog converter (DAC) 220, and a power amplifier 230. For some embodiments, the TPC circuit 210, the DAC 220, and the power amplifier 230 can be well-known components. During normal operation, the core logic 110 sends digital data signals to the transmitter circuit 200 for wireless transmission by the transmission antenna 102, and also sends a power correction value (PCV) associated with the current operating temperature to the transmitter circuit 120. The digital data is processed by the TPC circuit 210, which selectively applies a gain value or an attenuation value to the digital data signal to maintain a constant output signal power level. More specifically, for some embodiments, the TPC circuit 210 selects a power level setting and associated gain value from the TPC table 211 for use by the power amplifier 230 in amplifying the output signal, and can selectively adjust the power level setting and associated gain value in response to the power correction values received from the LUT 111 that were dynamically derived for the current operating temperature. The processed digital signal is converted to an analog signal by the DAC 220, which provides the resulting analog signal to the power amplifier 230. The power amplifier 230 amplifies the analog output signal for transmission as the transmission signal Tx by the transmission antenna 102 in response to the power level setting and associated gain value provided by the TPC circuit 210. The power amplifier 230, which is well-known, typically exhibits a wide range of power level variation due to its sensitivity to thermal and process variations. Accordingly, present embodiments discussed below can be used to compensate for such undesirable power level variations.

As discussed above, when a transmission downtime is detected, the core logic 110 asserts the MODE_SEL and EN signals to indicate the beginning of the calibration mode, and then provides a test signal of a selected frequency and power level to the transmitter circuit 120, which in turn outputs the test signal as Tx. The switching circuit 140 routes the output test signal directly from the transmitter circuit 120 to the input of the receiver circuit 130 (e.g., without using the antennas 102 or 104). In response thereto, the receiver circuit 130 processes the test signal, which is then provided to the test circuit 150.

Once enabled by assertion of the enable signal EN, the test circuit 150 uses the test signal and a measurement of the current operating temperature to generate a corresponding power correction value that is specific to the device 100 (e.g., such that the power correction value reflects process variations and operating characteristics associated with the device). More specifically, the test circuit 150 measures the power of the test signal generated by the core logic 110 and provided thereto by the receiver circuit 130, compares the measured power level with a reference value indicative of the expected power level of the test signal, and then derives a corresponding dynamic power correction value in response to the comparison. The dynamically derived power correction value is then stored in a location of the compensation look-up table 111 associated with the measured operating temperature (e.g., thereby replacing the predetermined power correction value initially programmed therein prior to delivery of device 100 to the customer). Then, the core logic 110 de-asserts the EN and MODE_SEL signals, thereby returning the device 100 to its normal operational mode in which the test circuit 150 is disabled and the switching circuit 140 connects the reception antenna 104 to the receiver circuit 130 and decouples the transmitter circuit 120 from the receiver circuit 130. Thereafter, during subsequent operation of the device 100, the core logic 110 can use the updated power correction value for gain/attenuation adjustments at the corresponding operating temperature to compensate for power distortion and maintain the transmission power of the output signals at the specified power level.

Thus, in accordance with present embodiments, the ability to dynamically update power correction values for various operating temperatures can be used to accurately compensate for process variations inherent in the fabrication of semiconductor devices. For example, the actual power of output signals transmitted by the device 100 at 50° C. may be different than the predicted level of such signals determined during testing of the selected test device, and therefore the power correction value derived during the calibration mode is more accurate than the corresponding predetermined power correction value. Further, because the core logic 110 can continually update (e.g., re-calibrate) the power correction values for various operating temperatures of device 100 during periods of transmission downtime, the output characteristics of the device 100 are continually adjusted while the device is operating in the field, thereby also allowing the output power levels to be compensated for changes in device operating characteristics over time (e.g., as the device 100 ages).

Figure 3:
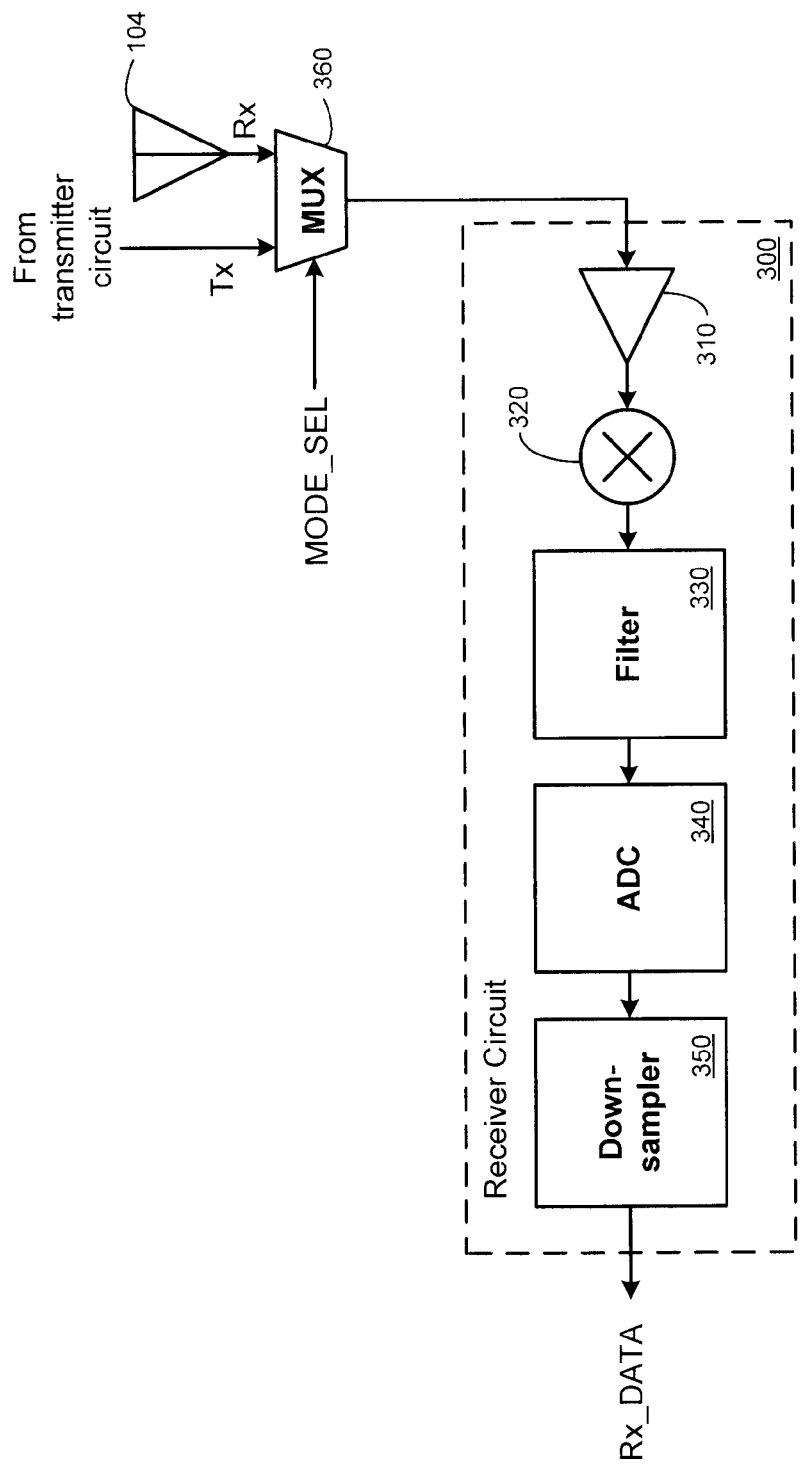
FIG. 3 is a block diagram of one embodiment of the receiver circuit of FIG. 1.

FIG. 3 is a block diagram of a receiver circuit 300 that is one embodiment of the receiver circuit 130 of FIG. 1, and also includes a multiplexer 360 that is one embodiment of the switching circuit 140. As shown in FIG. 3, the receiver circuit 300 includes an amplifier 310, an analog mixer circuit 320, a low pass filter 330, an analog-to-digital convertor (ADC) 340, and a down-sampler 350. Other elements of the receiver circuit 300 have been omitted for simplicity. During the normal operational mode, the receiver circuit 300 receives an RF signal from another wireless device via the reception antenna 104, processes the signal in a well-known manner to create the received data signal Rx DATA, and then forwards Rx DATA to the core logic 110 for additional processing.

During the calibration mode, the receiver circuit 300 receives the analog test signal output by the transmitter circuit 120 via the switching circuit 360, and processes the signal in a well-known manner before forwarding it to the test circuit 150. More specifically, for some embodiments, the test signal is first processed by the amplifier 310, modulated by the mixer circuit 320, and then filtered by the low-pass filter 330. During the calibration mode, the gain of the receiver amplifier 310 is kept at a value low enough to ensure linear operation. The filtered test signal is then converted to a digital signal by the well-known ADC 340, and then down-sampled by the down-sampler 350. For some embodiments for which the test tone is 1 kHz the signal output from the ADC has a frequency of 96 MHz, and is then down-sampled to 8 MHz by the down-sampler 350.

Figure 4A:
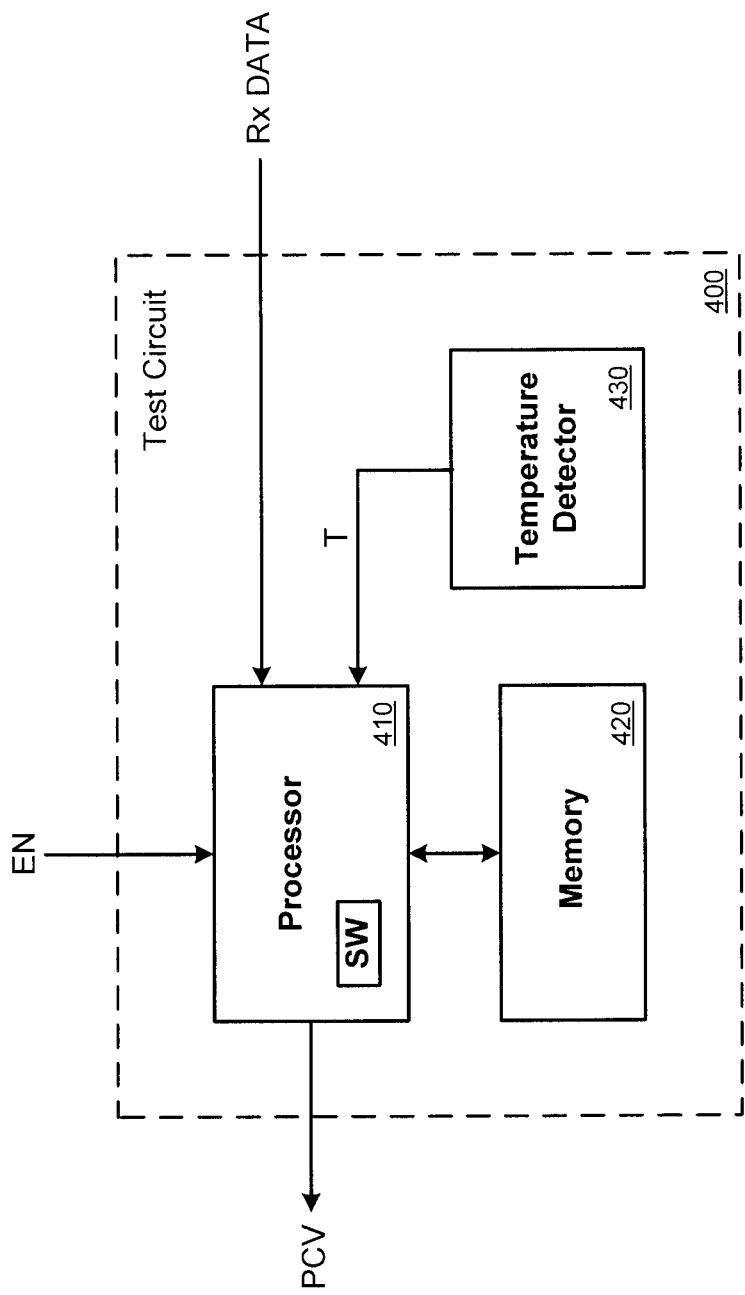
FIG. 4A is a block diagram of one embodiment of the test circuit of FIG. 1.

FIG. 4A is a block diagram of a test circuit 400 that is one embodiment of the test circuit 150 of FIG. 1. Test circuit 400 is shown to include a processor 410, a memory 420, and a temperature detector 430. Other well-known elements of the test circuit 400 are not shown for simplicity. The processor 410, which can be any well-known processor capable of executing instructions of a software program (SW), includes a first data input to receive data (Rx DATA) from the receiver circuit 130, a second data input coupled to the temperature detector 430, a bi-directional data port coupled to memory 420, and an output to provide a power correction value (PCV) to the core logic 110 (see also FIG. 1). Memory 420, which can be any suitable non-volatile memory device or element (e.g., a PROM, Flash memory, EEPROM, and so on), stores a plurality of reference power values for a corresponding plurality of various operating temperatures. The temperature detector 430, which is well-known, measures the current operating temperature (T) of the device 100.

During the calibration mode, the processor 410 is instructed to begin executing the SW in response to assertion of the enable signal EN, receives the test signal output by the transmitter circuit 120 and received by the receiver circuit 130, and receives the current operating temperature (T) from the temperature detector 430. More specifically, the processor 410 measures the power level of the received test signal, and then compares the measured power level with reference values stored in the memory 420 to calculate a dynamic power correction value for the corresponding operating temperature, which is then stored in a corresponding location of the compensation look-up table 111 provided within the core logic 110. In this manner, the test circuit 400 can dynamically update the power correction values stored in the compensation look-up table 111 by replacing previous values (e.g., the predetermined values derived during testing of another similarly-designed test device) with recent values that more accurately reflect the process variations and/or operating characteristics specific to the device 100.

Figure 4B:
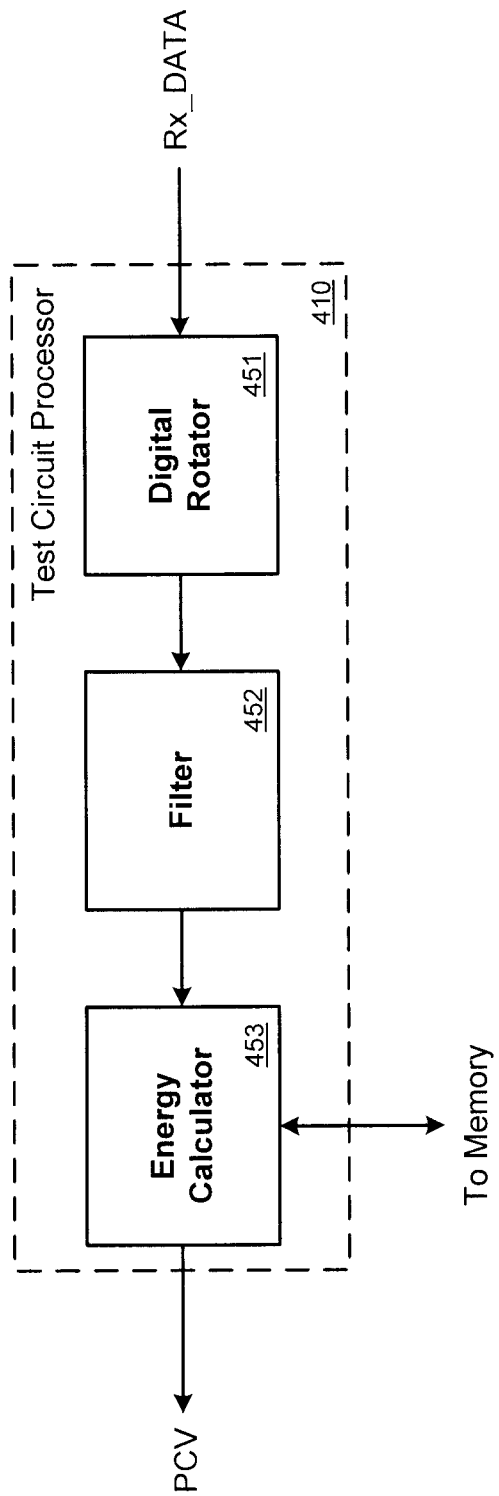
FIG. 4B is a block diagram of one embodiment of the processor of the test circuit of FIG. 4A.

FIG. 4B is a block diagram of one embodiment of the processor 410. The processor 410 of FIG. 4B is shown to include a digital rotator 451, a low-pass filter 452, and an energy calculator 453. Other well-known elements of the processor 410 are not shown for simplicity. During the calibration mode, the processor 410 receives the test signal as Rx_DATA from the receiver circuit 130, and the digital rotator 451 measures the transmission power level of the test signal. For some embodiments, the digital rotator 451 measures the power level of the third order harmonic of the test signal, which in turn indicates the level of power distortion in the test signal. More specifically, the power level of the third order harmonic can be used to determine the point at which the output transmit power becomes non-linear with respect to the power level setting of the power amplifier 230 provided within the transmitter circuit 120, as described in more detail below with respect to FIG. 5.

Then, the low-pass filter 452 filters out unwanted frequencies of the test signal. More specifically, the low-pass filter 452 is configured to filter out frequency components greater than a predetermined value, thereby allowing only those components of the test signal having frequencies less than the predetermined value to pass to the energy calculator 453. For some embodiments, the test signal is a 1 kHz tone signal, and the cut-off frequency of the low-pass filter 452 is set to between approximately 0.1 kHz and 1 kHz. Then, the energy calculator 453 measures the energy remaining in the filtered test signal, which corresponds to the third order harmonic signal energy. Referring also to FIG. 4A, the measured energy value is then forwarded to memory 420 for storage therein, along with the corresponding temperature value provided by the temperature detector 430. For other embodiments, the processor 410 can include other memory elements for storing the measured energy and corresponding temperatures.

Figure 5:
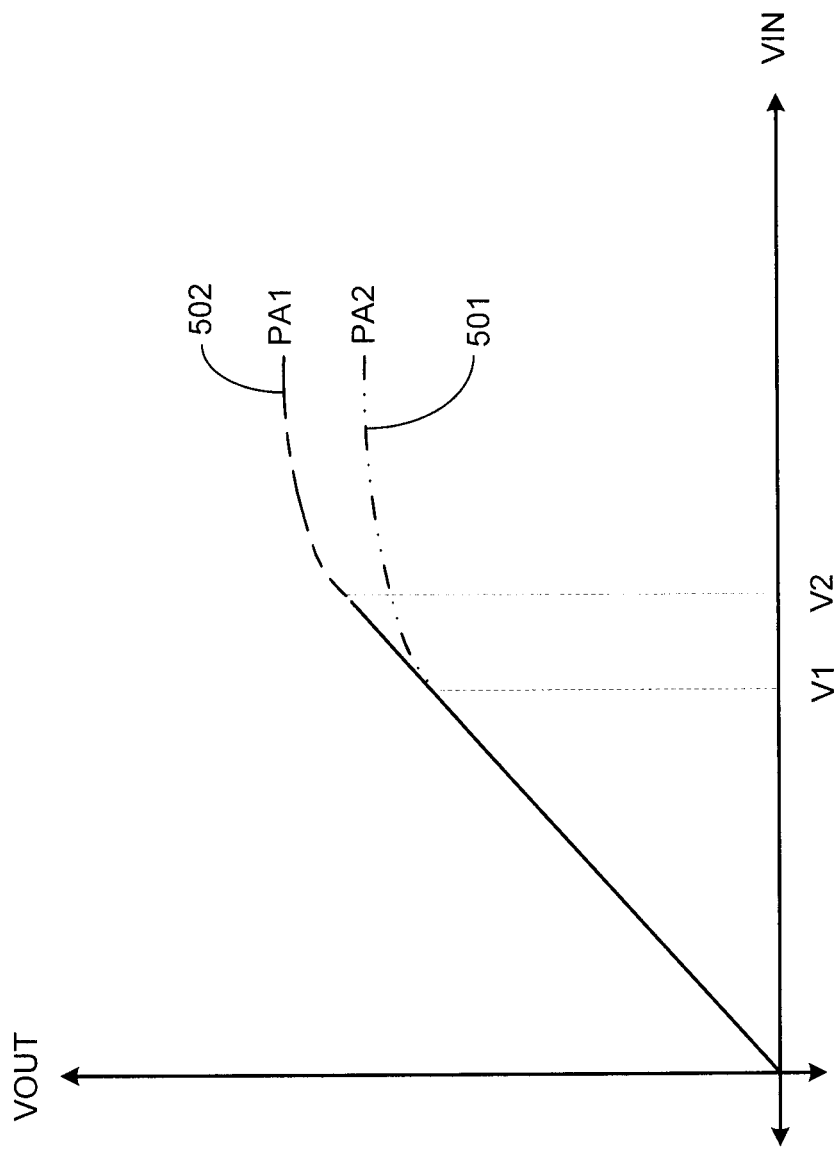
FIG. 5 is a graph depicting the non-linear transfer functions of power amplifiers.

FIG. 5 is a graph depicting the non-linear transfer functions of power amplifiers such as the power amplifier 230 of FIG. 2. The solid line depicts the linear region of operation for which the relationship between the input voltage (VIN) and the output voltage (VOUT) of the power amplifier has a constant slope (e.g., is linear), and the dashed lines 501 and 502 depict the non-linear regions of different power amplifiers PA1 and PA2 of the same design. The non-linear regions depicted by dashed lines 501 and 502 result from third-order harmonic terms in the power amplifiers' transfer functions that cause the output voltage to level off as the input voltage increases beyond a certain amount. However, because of process variations inherent in the fabrication of semiconductor devices, the non-linear region begins at different points (e.g., at different values of the input voltage VIN) for different power amplifiers of the same design. For the exemplary graph of FIG. 5, the non-linear region for power amplifier PA1 begins at voltage V1, and the non-linear region for power amplifier PA2 begins at a higher voltage V2.

Thus, the transfer function of the power amplifier not only becomes non-linear at different voltages for different operating temperatures but also varies between devices. Accordingly, the predetermined power correction values stored in the compensation look-up table 111 of the device 100, which as mentioned above were derived from testing a different device of the same design, may not accurately reflect the output characteristics of the device 100 when deployed in the field. As a result, when the test circuit 400 of the device 100 measures the power level of the output signal during the calibration mode, it is important to know the point at which the transfer function of the device's power amplifier 230 becomes non-linear so that the associated power correction values can be derived in an accurate manner and subsequently applied to adjust the gain of the power amplifier 230 in the device's transmitter circuit 120. Otherwise, if the power correction values are derived when the power amplifier operates in the distortion region (e.g., the non-linear region), the power correction values may not provide adequate compensation to maintain a constant output power over temperature variations.

For some embodiments, the linear relationship between the input voltage and the output voltage of the power amplifier 230 can be determined using well-known least mean square (LMS) techniques. For other embodiments, the linear relationship between the input voltage and the output voltage of the power amplifier 230 can be determined using other techniques (e.g., least square, recursive least square, and so on). Further, referring again to FIG. 4B, because the third-order harmonic term in the power amplifier's transfer function is a cubed term and therefore non-linear, the power level of the third-order harmonic provided by the digital rotator 451 can be used to determine the point (e.g., the output voltage) at which the transfer function becomes non-linear. In this manner, if the current power level setting of the power amplifier 230 results in the power amplifier 230 operating in the distortion region, the power level setting can be adjusted (e.g., to the next highest level) to ensure that the power amplifier 230 operates in the linear region.

Figure 6:
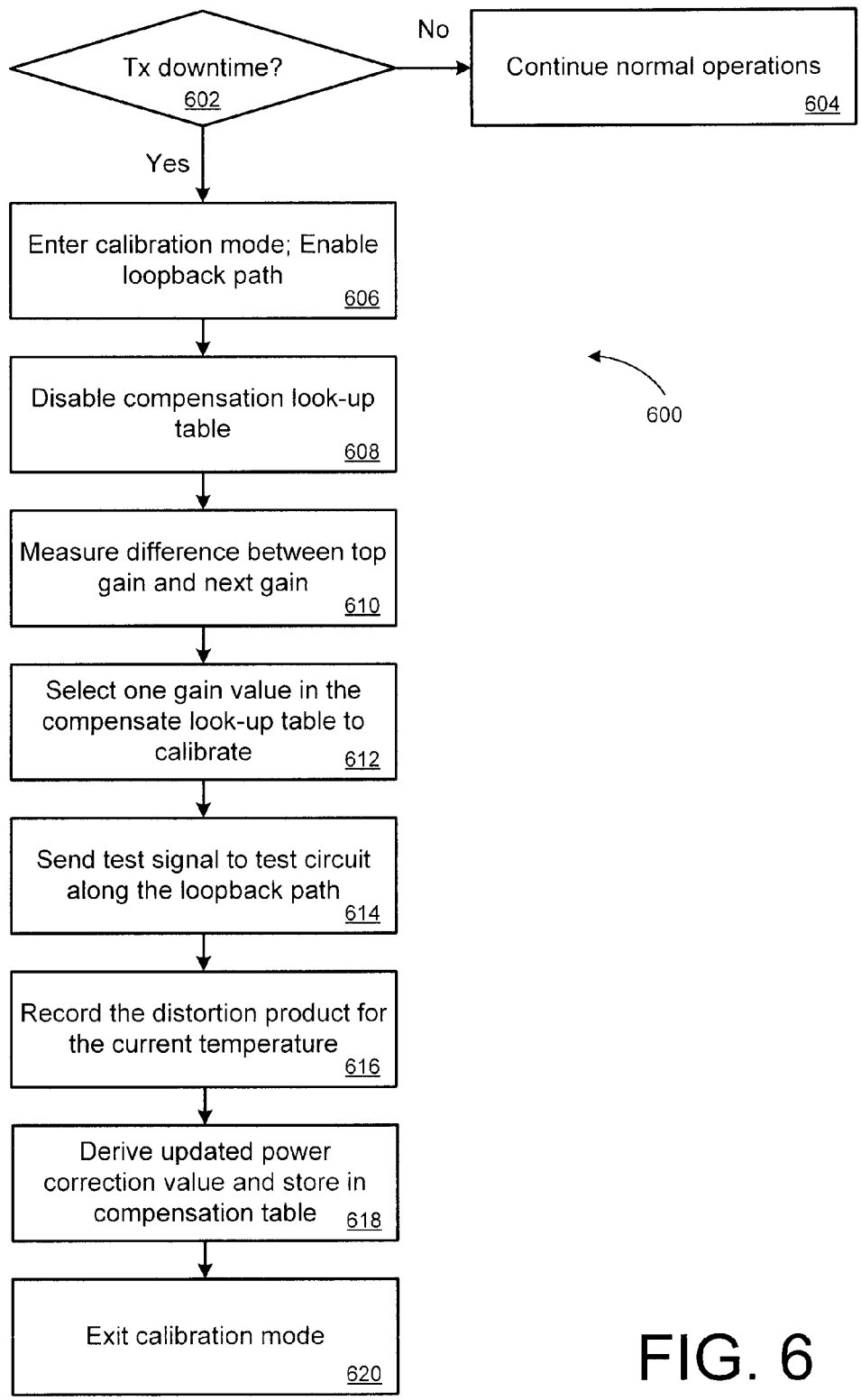
FIG. 6 is a flow chart depicting an exemplary operation for adjusting transmission power in accordance with some embodiments.

FIG. 6 is a flow chart illustrating an exemplary operation for dynamically calibrating the transmit output power of device 100 for temperature variations in accordance with the present embodiments. First, the wireless communication device 100 determines whether there is a transmission downtime (602). If transmission downtime is not detected, normal transmission and reception operations of device 100 continue (604).

If transmission downtime is detected, as tested at 602, then the device 100 enters the calibration mode and enables the loopback path between the transmitter circuit 120 and the receiver circuit 130 via the switching circuit 140 (606). As discussed above, to enter the calibration mode, the core logic 110 asserts the signal MODE_SEL, which causes the switching circuit 140 to connect the output of the transmitter circuit 120 to the input of the receiver circuit 130. The core logic 110 also asserts the signal EN to enable the test circuit 150 to receive and measure the power level of a test signal output by the transmitter circuit 120.

The assertion of EN and/or MODE_SEL can also be used to disable operation of the compensation look-up table 111 during the calibration mode (608). Disabling the compensation look-up table 111 prevents previously stored power correction values (PCVs) stored in the compensation look-up table 111 from affecting generation of the test signal to be measured by the test circuit 150.

Figure 7:
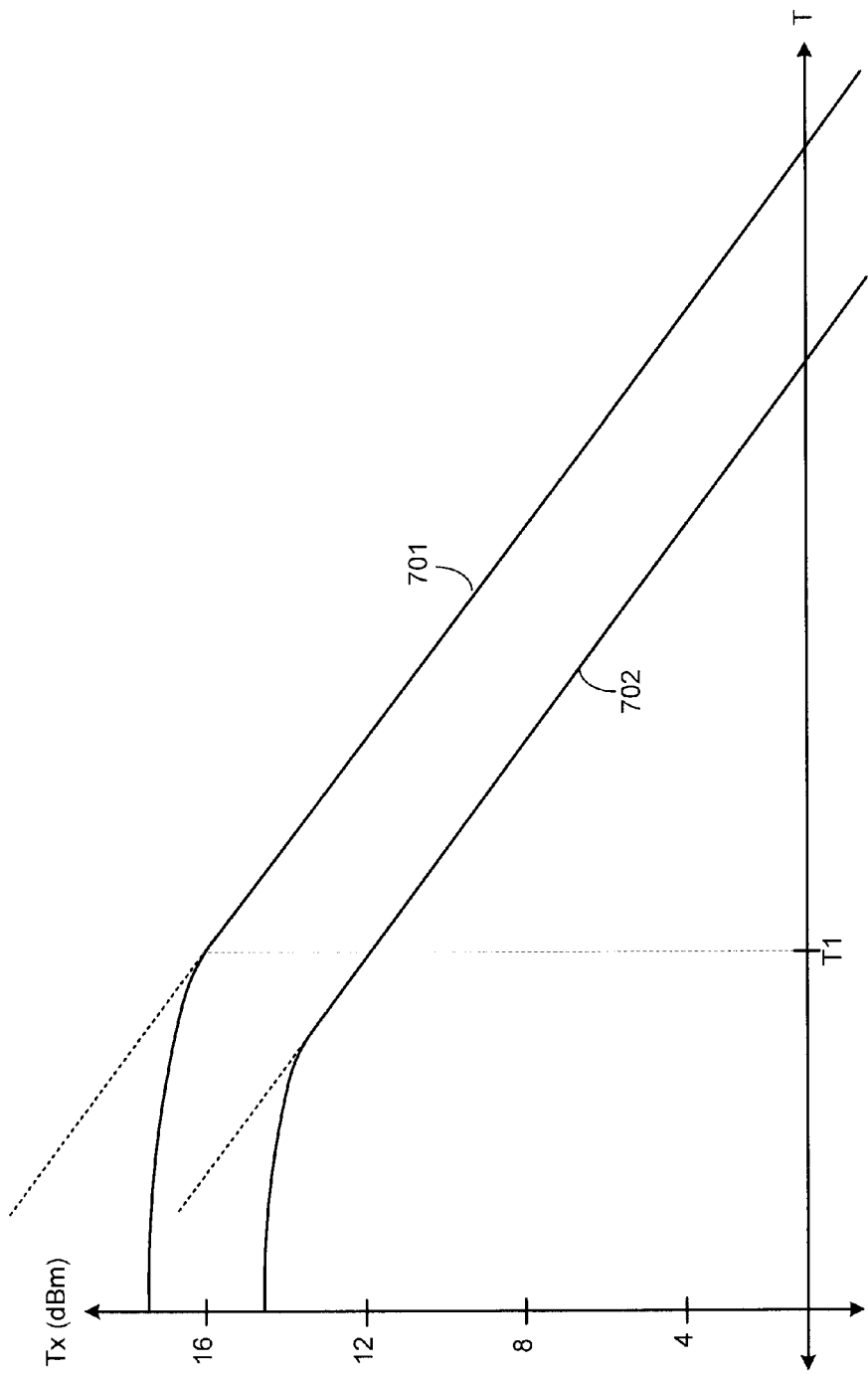
FIG. 7 is a graph depicting variations in the non-linearity relationship between transmission power and temperature for different devices of the same design.

Then, the difference between output power levels at the top gain level and the next lower gain level is measured (610). For example, referring to FIG. 7, the power level setting of the power amplifier 230 is first set to the top level of 16 dBm, and the power level of the resulting output signal (depicted by line 701) is measured. Next, the power level setting of the power amplifier 230 is set to the next highest gain level of 12 dBm, and the power level of the resulting output signal is measured (depicted by line 702). Then, the difference between the two measured power levels for the gain settings of 16 dBm and 12 dBm are calculated. The difference in output power level can be accurately measured even if the gain of the loopback path is not known because the difference measurement is relative.

Thus, if there were not any non-linear characteristics associated with the power amplifier 230 across temperature variations, the delta between the top gain setting of 16 dBm and the next gain setting of 12 dBm would always be 4 dB. However, because the non-linear characteristics of the power amplifier 230 do vary with respect to temperature (as well as with respect to voltage), the delta between the top gain setting of 16 dBm and the next gain setting of 12 dBm may not always be the same (e.g., 4 dB), which in turn can violate applicable Bluetooth signal transmission protocols. For example, at an operating temperature T=100° C., the actual transmit powers at the top gain setting and the next gain setting may be 16.5 dBm and 14 dBm, respectively, which gives a delta equal to 16.5 dBm−14 dBm=2.5 dBm. In contrast, at an operating temperature T=−40° C., the actual transmit powers at the top gain setting and the next gain setting may be 15 dBm and 11 dBm, respectively, which gives a delta equal to 15 dBm−11 dBm=4 dBm. Accordingly, to maintain a constant output signal power over temperature while also maintaining a constant delta between adjacent power level setting of the power amplifier 230 over temperature, it is necessary to estimate the temperature at which the operating characteristics of the power amplifier become non-linear. More specifically, in accordance with present embodiments, the temperature at which the operating characteristics of the power amplifier become non-linear (e.g., reach the amplifier's saturation point) can be determined by measuring the distortion level of the output signal.

Next, a power setting level and/or gain level in the TPC gain table is selected to calibrate for finding the point at which the transfer function of the power amplifier becomes non-linear (612). Then, the core logic 110 generate the test tone signal (614), and the test circuit 150 measures the distortion product for the current temperature to generate the updated power correction value (616). Thus, as described above, the distortion product for the test tone signal indicates whether the power amplifier 230 is operating in a linear manner for the current operating temperature and the current power level setting. For example, suppose that at the top gain setting of 16 dBm, the power amplifier 230 saturates at 5° C. and the output signal power reaches 16.5 dBm. Because the predetermined transmission power correction values are approximated by a linear function (with respect to temperature), these values inaccurately compensate for power variations (with respect to temperature) when the power amplifier 230 is operating in the non-linear region. As a result, the distortion product values derived from the test tone signals are used to determine when to apply the power correction values from the compensation table 111 to adjust the gain values stored in the TPC table 211.

The updated power correction value is stored in the compensation table 111 within the core logic (618), and the device exits the calibration mode (620). Thereafter, the power setting and a gain/attenuation value indicated by the corresponding power correction value can be used by the transmitter circuit 120 to maintain a constant transmit power level.

While particular embodiments have been shown and described, it will be obvious to those skilled in the art that changes and modifications may be made without departing from this disclosure in its broader aspects, and therefore, the appended claims are to encompass within their scope all such changes and modifications that fall within the true spirit and scope of this disclosure.

What is claimed is:

1. A method for maintaining a constant transmission output power across temperature variations in a wireless communication device, comprising:
    selectively entering a calibration mode in response to a transmission downtime in the device;
    enabling a loopback path between a transmitter circuit and a receiver circuit in the device during the calibration mode;
    transmitting a test signal from the transmitter circuit, along the loopback path through the receiver circuit, to a test circuit;
    measuring a distortion product for the test signal;
    deriving a power correction value from the distortion product;
    measuring an operating temperature of the device; and
    storing the power correction value associated with the operating temperature in a look-up table, wherein measuring the distortion product comprises:
        measuring a difference between a first transmission power at a first gain level and a second transmission power at a second gain level; and
        selecting one of the first and second gain levels for calibration in response to the measured difference between the first transmission power and the second transmission power.

2. The method of claim 1, further comprising:
    exiting the calibration mode;
    supplying the power correction value to the transmitter circuit; and
    adjusting a gain level of an amplifier within the transmitter circuit in response to the supplied power correction value.

3. The method of claim 1, wherein measuring the difference between the first transmission power and the second transmission power comprises transmitting a first signal at the first gain level and transmitting a second signal at the second gain level.

4. The method of claim 1, wherein enabling the loopback path comprises connecting an output of the transmitter circuit to an input of the receiver circuit using a switching circuit controlled by a mode select signal.

5. The method of claim 4, wherein the mode select signal is asserted to indicate the calibration mode if the transmitter circuit does not transmit a wireless output signal for more than a predetermined time period.

6. A wireless communication device configured to maintain a constant transmission output power across temperature variations, comprising:
    means for selectively entering a calibration mode in response to a transmission downtime in the device;
    means for enabling a loopback path between a transmitter circuit and a receiver circuit in the device during the calibration mode;
    means for transmitting a test signal from the transmitter circuit, along the loopback path and the receiver circuit, to a test circuit;
    means for measuring a distortion product for the test signal;
    means for deriving a power correction value from the distortion product;
    means for measuring an operating temperature of the device; and
    means for storing the power correction value associated with the operating temperature in a look-up table, wherein the means for measuring the distortion product is to:
        measure a difference between a first transmission power at a first gain level and a second transmission power at a second gain level; and
    select one of the first and second gain levels for calibration in response to the measured difference between the first transmission power and the second transmission power.

7. The device of claim 6, wherein the means for enabling the loopback path comprises a switching circuit that selectively connects an output of the transmitter circuit to an input of the receiver circuit in response to a mode select signal.

8. The device of claim 7, wherein the mode select signal is asserted to indicate the calibration mode if the transmitter circuit does not transmit a wireless output signal for more than a predetermined time period.

9. The device of claim 7, wherein:
    during a normal operational mode, the switching circuit routes signals received from a reception antenna to the receiver circuit; and
    during the calibration mode, the switching circuit routes the test signal from the transmitter circuit to the test circuit via the receiver circuit.

10. The device of claim 6, further comprising:
    means for exiting the calibration mode;
    means for supplying the power correction value to the transmitter circuit; and
    means for adjusting a gain level of an amplifier within the transmitter circuit in response to the supplied power correction value.

* * * * *